US010650945B2

(12) United States Patent
Lim et al.

(10) Patent No.: US 10,650,945 B2
(45) Date of Patent: May 12, 2020

(54) FUNCTIONAL CONTACTOR AND PORTABLE ELECTRONIC DEVICE HAVING SAME

(71) Applicant: AMOTECH CO., LTD., Incheon (KR)

(72) Inventors: Byung Guk Lim, Incheon (KR); Yun Suk Choi, Incheon (KR); Yoon-Ho Hwang, Seoul (KR)

(73) Assignee: AMOTECH CO., LTD., Incheon (KR)

(*) Notice: Subject to any disclaimer, the term of this patent is extended or adjusted under 35 U.S.C. 154(b) by 301 days.

(21) Appl. No.: 15/740,825

(22) PCT Filed: Jul. 1, 2016

(86) PCT No.: PCT/KR2016/007102
§ 371 (c)(1),
(2) Date: Dec. 29, 2017

(87) PCT Pub. No.: WO2017/003246
PCT Pub. Date: Jan. 5, 2017

(65) Prior Publication Data
US 2018/0190413 A1    Jul. 5, 2018

(30) Foreign Application Priority Data

Jul. 1, 2015  (KR) .................. 10-2015-0094281
Feb. 15, 2016 (KR) .................. 10-2016-0017383
Feb. 15, 2016 (KR) .................. 10-2016-0017386

(51) Int. Cl.
*H01C 7/12* (2006.01)
*H01R 13/24* (2006.01)
(Continued)

(52) U.S. Cl.
CPC .............. *H01C 7/12* (2013.01); *H01R 13/24* (2013.01); *H01R 13/2414* (2013.01);
(Continued)

(58) Field of Classification Search
CPC .. H01R 13/2414; H01R 13/24; H05K 9/0015; H05K 5/0086; H04M 1/02; H04M 1/026; H04M 1/0277; H01C 7/12
(Continued)

(56) References Cited

U.S. PATENT DOCUMENTS 4,811,164 A  * 3/1989 Ling ...................... H01G 4/40
                                                 156/89.14
2014/0160704 A1 * 6/2014 Janssen .................. H01G 2/06
                                                 361/759
(Continued)

FOREIGN PATENT DOCUMENTS

JP       08-330027 A    12/1996
JP     2000090996 A     3/2000
(Continued)

*Primary Examiner* — Kevin J Comber
(74) *Attorney, Agent, or Firm* — Bayramoglu Law Offices LLC

(57) ABSTRACT

A functional contactor and a portable electronic device having same. The functional contactor includes a conductive elastic part having elasticity and electrically connected to a conductor of an electronic device; and a functional element including a first electrode mounted on a circuit board of the electronic device, a second electrode electrically connected to the underside of the conductive elastic part, and a dielectric formed between the first electrode and the second electrode.

6 Claims, 11 Drawing Sheets

(51) Int. Cl.
  *H05K 9/00*  (2006.01)
  *H05K 5/00*  (2006.01)
  *H04M 1/02*  (2006.01)
(52) U.S. Cl.
  CPC ............ *H04M 1/02* (2013.01); *H04M 1/026* (2013.01); *H05K 5/0086* (2013.01); *H05K 9/0015* (2013.01); *H04M 1/0277* (2013.01)
(58) Field of Classification Search
  USPC .......................................... 316/126; 361/126
  See application file for complete search history.

(56) References Cited

U.S. PATENT DOCUMENTS

2016/0360015 A1\* 12/2016 Lee .................. H01Q 1/243
2017/0077891 A1\*  3/2017 Kim ................. H05K 1/0296

FOREIGN PATENT DOCUMENTS

| | | |
|---|---|---|
| JP | 2006-164600 A | 6/2006 |
| JP | 2007-141533 A | 6/2007 |
| JP | 2014-529887 A | 11/2014 |
| KR | 20-2008-0001363 U | 5/2008 |

\* cited by examiner

FUNCTIONAL CONTACTOR AND PORTABLE ELECTRONIC DEVICE HAVING SAME

CROSS REFERENCE TO RELATED APPLICATIONS

This application is the national phase entry of International Application No. PCT/KR2016/007102, filed on Jul. 1, 2016, which claims priority from the Korean patent application no. 10-2015-0094281 filed on Jul. 1, 2015, Korean patent application no. 10-2016-0017386 filed on Feb. 15, 2016 and Korean patent application no. 10-2016-0017383 filed on Feb. 15, 2016, the entire contents of which are incorporated herein by reference.

TECHNICAL FIELD

The present invention relates to a functional contactor for an electronic device such as a smartphone, and more particularly, to a functional contactor capable of providing various functions and a portable electronic device having the same.

BACKGROUND

In recent years, along with miniaturization and multi-functionalization, portable electronic devices have various components densely arranged therein. Accordingly, a conductive gasket is used between an external housing and a built-in circuit board of a portable electronic device in order to reduce impact from the outside and also decrease electromagnetic waves penetrating into or leaking from the portable electronic device.

Also, a portable electronic device may include a plurality of antennas corresponding to functions due to multi-functionalization. At least some of the antennas may be built-in antennas and may be disposed on an external housing of the portable electronic device. Accordingly, a conductive contactor for providing electrical contact between an antenna disposed on the external housing and a built-in circuit board of the portable electronic device is used.

Also, recently, the adoption of a metal housing has been increasing in order to improve aesthetic impression and robustness thereof.

As a result, an electric path may be formed between the external housing and the built-in circuit board by a conductive gasket or a conductive contactor. In particular, as the metal housing and the circuit board form a loop, static electricity with high voltage may be instantaneously input through a conductor such as a metal housing having a large exposed surface area. In this case, the static electricity may be input into the built-in circuit board through the conductive gasket or the conductive contactor, thereby damaging the circuit such as an integrated circuit (IC).

Such a portable electronic device typically uses a charger to charge a battery. The charger rectifies external AC power to DC power and then transforms the DC power into low DC power suitable for the portable electronic device through a transformer. Here, in order to enhance electrical insulation of the transformer, a Y-CAP composed of capacitors is provided at both ends of the transformer.

However, when the Y-CAP does not have normal characteristics, such as in a case of a non-genuine charger or the like, DC power may not be sufficiently blocked by the Y-CAP. Furthermore, a leakage current may be generated by the AC power and may propagate along a ground part of the circuit.

The leakage current may be delivered even to a human-touchable conductor such as the external case of the portable electronic device. As a result, a user may feel an uncomfortable tingling sensation. In severe cases, the user may be injured by an electric shock accident.

Therefore, a protective element for protecting a user from the leakage current needs to be provided in the conductive gasket or the conductive contactor for connecting the metal housing and the circuit board.

Further, when the metal housing is used as an antenna, the conductive gasket or the conductive contactor needs to realize a high capacitance. This is because if the capacitance is low, signal attenuation occurs such that an RF signal is not smoothly delivered.

Thus, there is a need for a contactor having various functions for protecting a user or a circuit built in a portable electronic device as well as a simple electrical contact due to the use of a conductor such as a metal case.

However, additional components are needed to implement these various functions. Therefore, an additional space is required on a circuit board of a portable electronic device, which adversely affects miniaturization.

Such a functional contactor may maximize the area of the electrode in order to increase the capacitance of the functional element. In this case, when a contactor of a relatively small size is stacked on an electrode through soldering or when a functional element having the contactor stacked through soldering is mounted on a substrate through secondary soldering, the contactor is not fastened, and thus a failure occurs.

Also, generally, the contactor and the functional element are bonded to each other through soldering, and then the functional element having the contactor stacked thereon is bonded to the substrate through secondary soldering. In this case, a soldering part of the functional element and the contactor may be melted due to heat generated through the secondary soldering. Accordingly, a failure can occur in terms of adhesiveness, reliability, and the like of the contactor and thus may cause an electrical contact failure.

SUMMARY

Technical Problem

The present invention is designed in consideration of the aforementioned problems and is directed to providing a functional contact having a function of protecting a user or an internal circuit and a portable electronic device including the same.

The present invention is also directed to providing a functional contactor for preventing a portion at which a functional element and a contactor are bonded to each other from being melted through secondary soldering to prevent misalignment of the portion, prevent occurrence of a contact failure, and maintain reliability.

Technical Solution

In order to solve the above problems, there is provided a functional contactor including a conductive elastic part having elasticity and brought into electrical contact with a conductor of an electronic device; and a functional element having a first electrode mounted on a circuit board of the electronic device, a second electrode electrically connected to a lower side of the conductive elastic part, and a dielectric formed between the first electrode and the second electrode.

According to a preferred embodiment of the present invention, the functional element may have a withstand voltage higher than a rated voltage of an external power source of the electronic device.

Also, the conductive elastic part may be stacked on the second electrode of the functional element by means of a conductive adhesive layer or through a solder.

Also, the functional element may have a groove disposed at an upper side, the second electrode may be formed on a bottom surface of the groove, and the conductive elastic part may be fastened inside the groove by means of the conductive adhesive layer or through the solder.

Also, the dielectric may be made of a ceramic material, and the ceramic material may be a metal oxide compound containing one or more selected from among $Er_2O_3$, $Dy_2O_3$, $Ho_2O_3$, $V_2O_5$, $CoO$, $MoO_3$, $SnO_2$, $BaTiO_3$, and $Nd_2O_3$, may be a fired ceramic or a ferrite, or may contain any one of a ZnO-based varistor material, a Pr-based material, and a Bi-based material.

Also, the conductive elastic part may be any one of a conductive gasket, a silicone rubber pad, and a clip-shaped conductor with elasticity.

There is provided a functional contactor including a conductive elastic part having elasticity, brought into electrical contact with a conductor of an electronic device, and having a mounting electrode disposed at a lower surface; and a function part including a dielectric formed at a lower side of the mounting electrode and an external electrode formed at a lower side of the dielectric and mounted on a circuit board of the electronic device.

There is provided a functional contactor including a conductive elastic part having elasticity and brought into electrical contact with a conductor of an electronic device; an internal electrode disposed at a lower surface of the conductive elastic part; a dielectric formed at a lower side of the internal electrode; and an external electrode formed at a lower side of the dielectric and mounted on a circuit board of the electronic device.

There is provided a functional contactor including a conductive elastic part having elasticity and brought into electrical contact with a conductor of an electronic device; and a function part including an internal electrode electrically connected to a lower side of the conductive elastic part and a dielectric formed at a lower side of the internal electrode and mounted on a circuit board of the electronic device.

There is provided a functional contactor including a conductive elastic part having elasticity, brought into electrical contact with a conductor of an electronic device, and having a mounting electrode disposed at a lower surface; and a function part including a dielectric formed at a lower side of the mounting electrode.

There is provided a functional contactor including a conductive elastic part having elasticity and brought into electrical contact with a conductor of an electronic device; an internal electrode disposed on a lower surface of the conductive elastic part; and a dielectric formed at a lower side of the internal electrode and mounted on a circuit board of the electronic device.

There is provided a functional contactor fastened and electrically connected to a substrate by means of a first conductive bonding member. The functional contactor includes a functional element including a first electrode and a second electrode, the first electrode being brought into contact with the first conductive bonding member; a conductive elastic part disposed at an upper portion of the functional element; and a second conductive bonding member interposed between the conductive elastic part and the functional element or between the conductive elastic part and the second electrode in order to fasten and electrically connect the conductive elastic part and the functional element, wherein the second conductive bonding member has a higher melting point than the first conductive bonding member.

According to a preferred embodiment of the present invention, the first conductive bonding member and the second conductive bonding member may be made of different materials.

Also, the functional element may have at least one of an electric shock prevention function for blocking a leakage current of an external power source input from a ground of a substrate of an electronic device, a communication signal bypass function for passing a communication signal input from a conductive case, and an ESD protection function for passing static electricity without dielectric breakdown when the static electricity is input from the conductive case.

Also, the conductive elastic part may be brought in line contact or point contact with the conductor to decrease galvanic corrosion.

There is provided a portable electronic device including a human-touchable conductor; a component mounting pad of a circuit board; and a functional contactor mounted on the mounting pad and electrically connected in series to the conductor as described above.

There is provided a functional contactor assembly including a conductive elastic part having elasticity and brought into electrical contact with a conductor of an electronic device; a function part including an internal electrode electrically connected to a lower side of the conductive elastic part and a dielectric formed at a lower side of the internal electrode and mounted on a circuit board of the electronic device; and a conductive pad disposed on the circuit board, wherein the function part is mounted on the conductive pad.

According to a preferred embodiment of the present invention, a withstand voltage between the internal electrode and the conductive pad of the circuit board may be higher than a rated voltage of an external power source of the electronic device.

There is provided a functional contactor including a functional element; a conductive elastic part disposed at an upper portion of the functional element; and a second conductive bonding member interposed between the conductive elastic part and the functional element, wherein the second conductive bonding member has a higher melting point than a first conductive bonding member.

There is provided a functional circuit component including a substrate; a functional contactor disposed on the substrate; and a first conductive bonding member configured to fasten and electrically connect the functional connector to the substrate, wherein the functional contactor includes a functional element, a conductive elastic part disposed at an upper portion of the functional element; and a second conductive bonding member configured to fasten and electrically connect the conductive elastic part to the functional element, and wherein the second conductive bonding member has a higher melting point than the first conductive bonding member.

Advantages

According to the present invention, by providing a functional element or a function part at a contactor for connecting a conductor and a circuit board in a portable electronic device having the conductor, such as a metal case, exposed to the outside, it is possible to prevent damage to a user, such as electric shock or the like through the conductor, or breakage of an internal circuit.

Also, according to the present invention, by providing the functional element or the function part and the contactor in one body, it is possible to miniaturize the portable electronic device without needing a separate element for implementing a corresponding function and an additional space for the element.

Also, according to the present invention, by omitting redundant elements when mounting is performed on a circuit board and providing a function part by using only a minimum number of elements, it is possible to reduce a manufacturing cost and save resources used to manufacture the functional element.

Also, according to the present invention, by setting a bonding part for bonding the functional element and the contactor to have a melting point higher than that of a bonding part for bonding the functional element and the substrate, it is possible to prevent the bonding part for bonding the functional element and the contactor from being deformed and to maintain reliability even through two soldering processes.

DETAILED DESCRIPTION OF THE INVENTION

Figure 1:
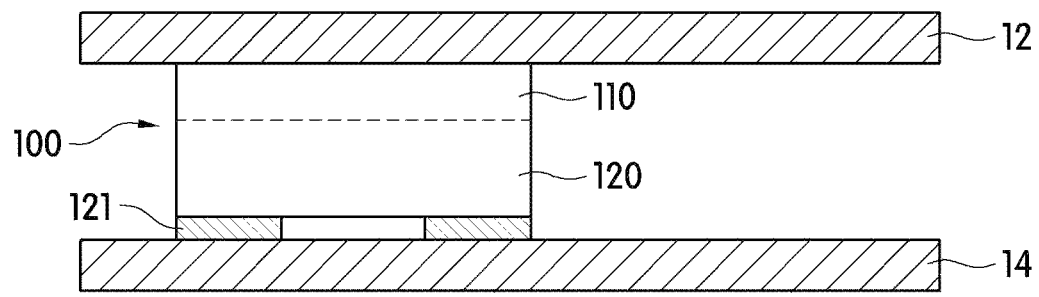
FIG. 1 is a sectional view of an example in which a functional contactor is applied to a portable electronic device according to an embodiment of the present invention.

Hereinafter, embodiments of the present invention will be described in detail with reference to the accompanying drawings so that they can be easily carried out by those skilled in the art. The present invention may, however, be embodied in many different forms and should not be construed as being limited to the embodiments set forth herein. In the accompanying drawings, portions irrelevant to the description of the present invention will be omitted for clarity. Moreover, like reference numerals refer to like elements throughout.

A functional contactor 100 according to an embodiment of the present invention includes a conductive elastic part 110 and a functional element 120.

Figure 2:
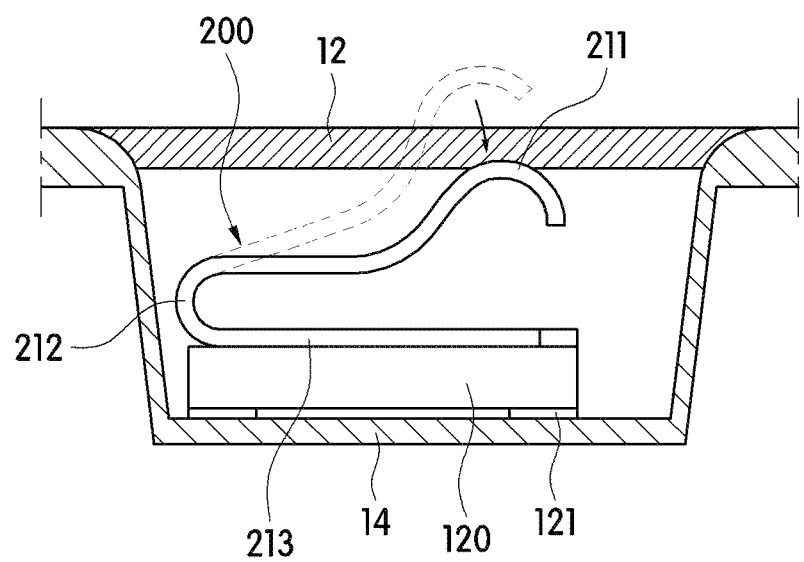
FIG. 2 is a sectional view of another example in which a functional contactor is applied to a portable electronic device according to an embodiment of the present invention.

As shown in FIGS. 1 and 2, the functional contactor 100 is used to electrically connect a circuit board 14 and a conductor 12 such as an external metal case in a portable electronic device.

Here, the portable electronic device may be an electronic device that is portable and easy to carry. As an example, the portable electronic device may be a portable terminal such as a smartphone and a cellular phone, a smart watch, a digital camera, a digital multimedia broadcasting (DMB) device, an e-book, a net book, a tablet PC, or a portable computer. Such an electronic device may include any suitable electronic components including antenna structures for communication with external devices. In addition, the electronic device may be a device that uses local network communication such as WiFi and Bluetooth.

The functional contactor 100 may have elasticity so that the functional contactor 100 may be pressed by an applied pressure for combining the conductor 12 with the portable electronic device and may be restored to its original state when the conductor 12 is detached from the portable electronic device.

Here, the conductor 12 may be provided to partially or entirely surround a side portion of the portable electronic device and may be an antenna for communication between the portable electronic device and an external device.

The conductive elastic part 110 may be in electrical contact with the conductor 12 of the portable electronic device and may have elasticity. The conductive elastic part 110 may be a conductor having the shape of a conductive gasket or a silicone rubber pad shown in FIG. 1 or an elastic clip shown in FIG. 2.

Here, when the conductive elastic part 110 is brought into surface contact with the conductor 12 like a conductive gasket or a silicone rubber pad, the conductive elastic part 110 may be integrally formed of a conductive material with elasticity. In this case, the conductive elastic part 110 may be shrunk toward the circuit board 14 when the conductive elastic part 110 is pressed by the conductor 12 and may be restored to its original state by the elasticity when the conductor 12 is separated from the portable electronic device.

According to this embodiment, as shown in FIG. 2, the conductive elastic part 110 may be provided as a clip-shaped elastic conductor (211, 212, and 213) and may be brought into conductive contact with the conductor 12. In this case, as shown in FIG. 2, when a contact part 211 is pressed by the circuit board 14, a curved part 212 with elasticity is pressed toward the circuit board 14, and when the conductor 12 is separated from the portable electronic device, the conductive elastic part 110 may be restored by elasticity of the curved part 212 to its original state, that is, to above a position where the circuit board 14 is mounted.

However, the present invention is not limited thereto, and the conductive elastic part 110 can have any structure as long as the structure is elastic.

When the conductive elastic part is brought into contact with the conductor, galvanic corrosion occurs due to a potential difference between heterogeneous metals. In order to minimize galvanic corrosion, it is preferable that the conductive elastic part have a small area of contact with the conductor.

That is, the conductive elastic part may be brought into surface contact with the conductor, but preferably may be brought into line contact and/or point contact with the conductor. As an example, when the conductive elastic part 110 is brought into surface contact with the conductor when the conductive elastic part 110 is a conductive gasket or a silicone rubber pad and may be brought into line contact and/or point contact with the conductor when the conductive elastic part 110 is a clip-shaped conductor.

The functional element 120 is electrically connected in series to the conductive elastic part 110. As an example, as shown in FIGS. 1 and 2, the functional element 120 may be disposed under the conductive elastic part 110. In this case, the functional element 120 may have a second electrode 122 (see FIG. 3) disposed on an upper surface thereof.

A groove 1202 (see FIG. 4) may be disposed at an upper portion of the functional element 120. The second electrode 122 may be disposed on a bottom surface of the groove 1202. The conductive elastic part 110 may be stacked on the second electrode 122 by means of a conductive adhesive layer or through a solder 111. This structure will be described later again.

In this case, the functional element 120 has a function of protecting a user or an internal circuit and may include at least one of, for example, an electric shock protection device, a varistor, a suppressor, a diode, and a capacitor.

A functional contactor according to an embodiment of the present invention will be described in detail below with reference to FIGS. 3 and 4.

Figure 3:
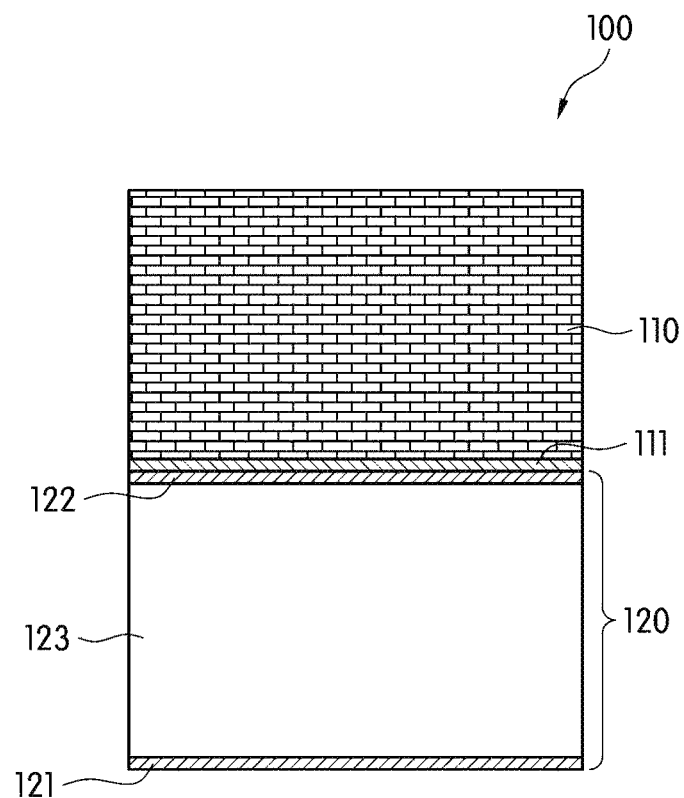
FIGS. 3 and 4 are sectional views of an example of a functional contactor according to an embodiment of the present invention.
Figure 4:
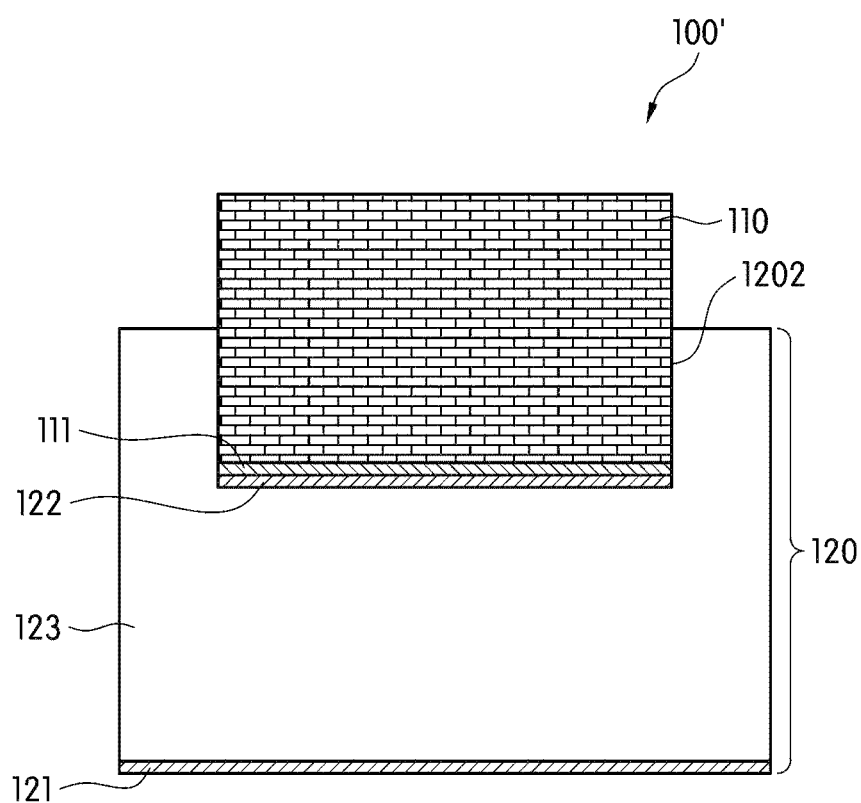

As shown in FIGS. 3 and 4, functional contactors 100 and 100' may each include a conductive gasket 110 and a functional element 120 as a conductive elastic part.

The conductive gasket 110 may be integrally formed of a conductive material with elasticity. The conductive gasket 110 may include at least one of, for example, a polymer body manufactured by thermally pressing a conductive paste, a natural rubber, a sponge, a synthetic rubber, a heat-resistant silicone rubber, and a tube. The conductive gasket is not limited thereto and may include a conductive material with elasticity.

As shown in FIG. 1, the conductive gasket 110 may have an upper portion brought into surface contact with the conductor 12, such as a metal housing or an antenna, and a lower portion electrically connected to the functional element 120.

The functional element 120 includes a first electrode 121, a second electrode 122, and a dielectric 123. The functional element 120 may be a capacitor.

The capacitor can prevent damage to the user, such as electric shock through a conductor such as a metal case, or breakage of the internal circuit. For example, the capacitor can block a leakage current of an external power source input from a ground of a circuit board of the electronic device and can pass a communication signal input from the conductor 12.

The first electrode 121 is disposed at a lower portion the functional element 120 and is mounted on the circuit board 14 of the electronic device.

The second electrode 122 is disposed at an upper portion of the functional element 120 and is electrically connected to a lower portion of the conductive elastic part 110.

As shown in FIG. 3, the second electrode 122 at the upper portion of the functional element 120 is coated with the conductive adhesive layer 111, and the conductive gasket 110 may be stacked on the second electrode 122 by means of the conductive adhesive layer 111. Alternatively, the conductive gasket 110 may be stacked on the functional element 120 through soldering.

As shown in FIG. 4, the functional element 120 may have a groove 1202 formed on the upper surface thereof. Here, the second electrode 122 may be disposed on a bottom surface of the groove 1202 of the functional element 120. In this case, the conductive gasket 110 may be inserted into and stacked on the groove 1202 by means of the conductive adhesive layer 111 or a solder.

The dielectric 123 may be formed between the first electrode 121 and the second electrode 122.

The dielectric 123 may be made of a ceramic material. For example, the ceramic material may be made of a metal oxide compound containing one or more selected from among $Er_2O_3$, $Dy_2O_3$, $Ho_2O_3$, $V_2O_5$, $CoO$, $MoO_3$, $SnO_2$, $BaTiO_3$, and $Nd_2O_3$ or made of a ferrite. A fired ceramic such as a low temperature co-fired ceramic (LTCC) or a high temperature co-fired ceramic (HTCC) may be used as the ceramic material.

In addition, a ZnO-based varistor material, a Pr-based or Bi-based material, or the like may be used as the ceramic material. $Er_2O_3$, $Dy_2O_3$, $HO_2O_3$, $V_2O_5$, $CoO$, $MoO_3$, $SnO_2$, $BaTiO_3$, and $Nd_2O_3$ that have been mentioned above as the metal oxide compound should be understood as an example. It will be appreciated that other types of metal oxide compounds that are not mentioned may also be used.

Alternatively, the functional element 120 may be made of a plastic material. In this case, the first electrode 121 and the second electrode 122 are disposed on an upper surface and a lower surface of a dielectric sheet to face each other and then are integrally formed through a firing or hardening process.

Here, the dielectric constant of the dielectric 123, the thickness between the first electrode 121 and the second electrode 122, and the areas of the first electrode 121 and the second electrode 122 may be set so that the functional element 120 has a withstand voltage higher than the rated voltage of the external power source of the electronic device and so that a capacitance capable of passing a communication signal input from the conductor 12 is formed.

In this embodiment, it has been described that the functional contactor 100 is formed by combining the conductive elastic part 110 and the functional element 120 by means of a conductive adhesive layer or through soldering, but the present invention is not limited thereto.

As an example, the functional contactor 100 is formed by providing a mounting pad on a lower surface of a conductive elastic part and combining a function part with a lower surface of the mounting pad. In this case, the function part includes the dielectric and an external electrode.

Here, the mounting pad is provided to directly combine the conductive elastic part with a pad of the circuit board through soldering, and is a copper plate or a plate coated with stainless steel (SUS) and chromium.

The mounting pad of the conductive elastic part corresponds to the second electrode 122 of the functional element 120 as shown in FIGS. 3 and 4, and the external electrode corresponds to the first electrode of the functional element 120.

In this case, the conductive elastic part and the function part may be combined with each other by means of an insulating adhesive layer. That is, the mounting pad of the conductive elastic part may be stacked on the dielectric of the functional element by means of the insulating adhesive layer.

As shown in FIGS. 5 to 8, when functional contactors 200 and 200' each have a conductive elastic part which is a clip-shaped conductor 210, the clip-shaped conductor 210 includes a contact part 211, a curved part 212, and a terminal part 213.

The contact part 211 may have a curved shape. As shown in FIG. 2, the contact part 211 may be in conductive contact with the conductor 12. The contact may be any one of point contact, line contact, and surface contact. The curved part 212 may be formed by extending the contact part 211 and may have elasticity. The terminal part 213 may include a terminal that is electrically connected with the functional element.

The contact part 211, the curved part 212, and the terminal part 213 may be integrally formed of a conductive material with elasticity.

Figure 5:
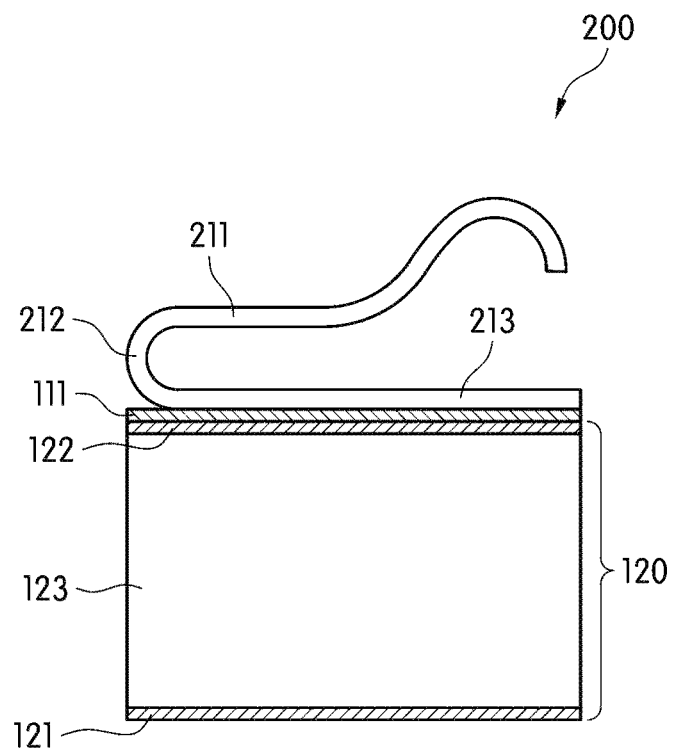
FIGS. 5 to 8 are sectional views and prospective views of another example of a functional contactor according to an embodiment of the present invention.

The functional element 120 may have a lower surface on which the first electrode 121 is formed and an upper surface on which the second electrode 122 is formed. In this case, as shown in FIG. 5, the second electrode 122 disposed on the upper surface of the functional element 120 may be coated with the conductive adhesive layer 111, and the clip-shaped conductor 210 may be stacked on the second electrode 122 by means of the conductive adhesive layer 111. Alternatively, the conductive gasket 110 may be stacked on the functional element 120 through soldering.

Figure 6:
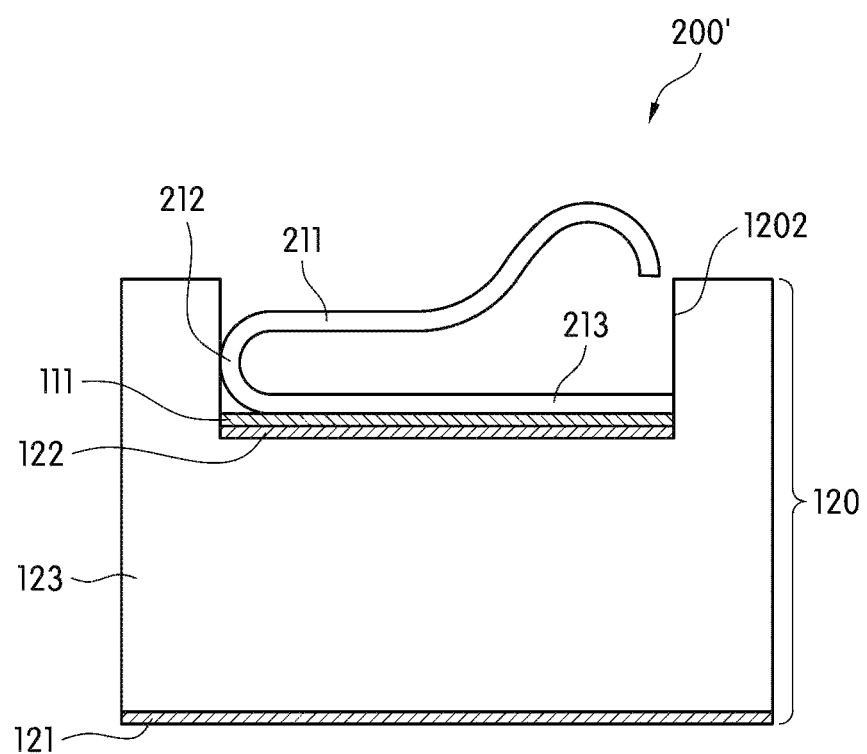
Figure 7:
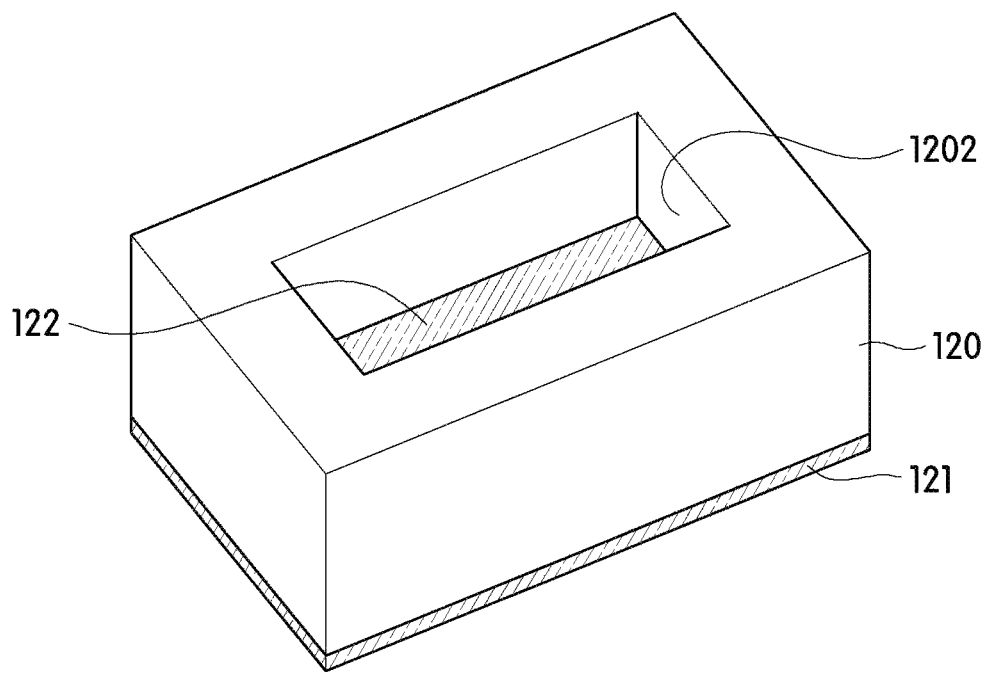
Figure 8:
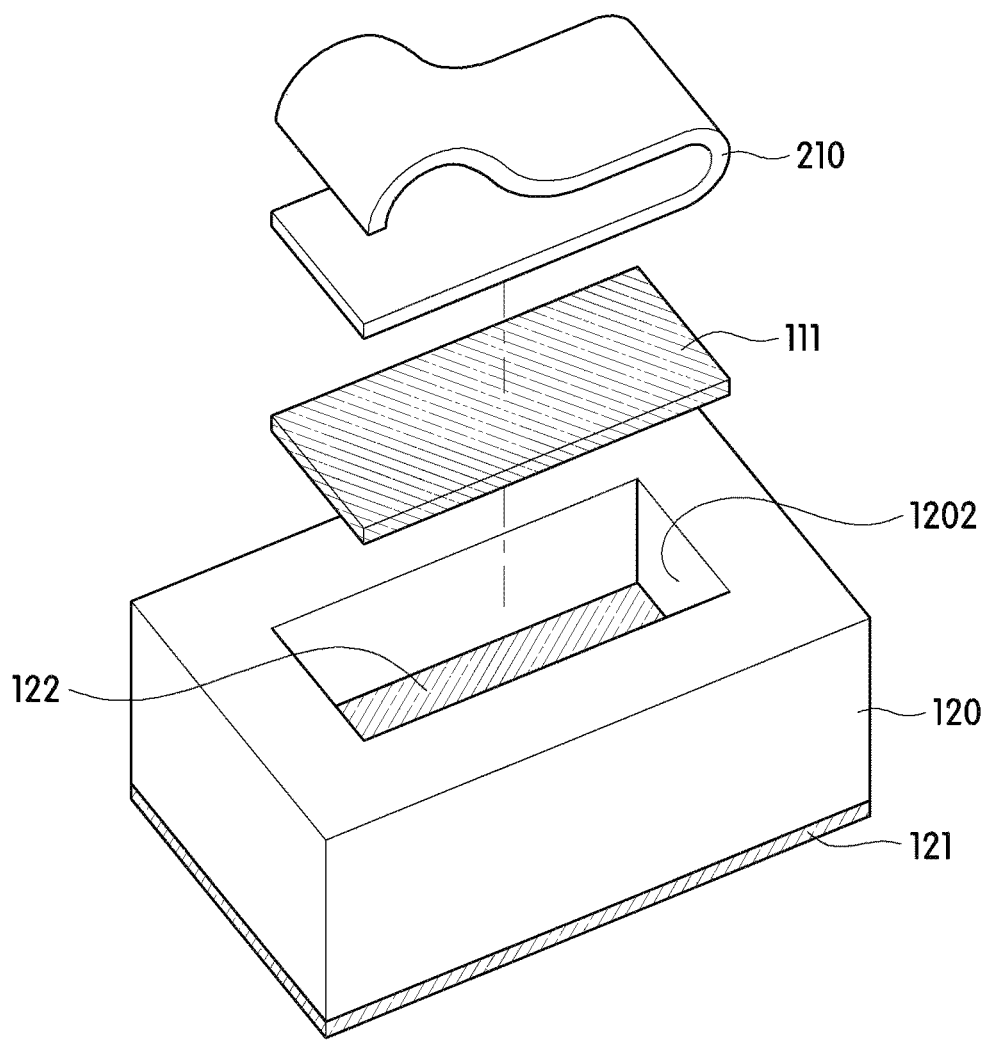

Also, as shown in FIGS. 6 to 8, the functional element 120 may have a groove 1202 disposed on the upper surface thereof. Here, the second electrode 122 may be disposed on a bottom surface of the groove 1202 of the functional element 120. In this case, the clip-shaped conductor 210 may be inserted into and stacked on the groove 1202 by means of the conductive adhesive layer 111 or through soldering.

According to such a structure, the groove 1202 may serve as a side stopper and may be substituted for a side stopper installed in the clip-shaped conductor 210, thus reducing a manufacturing cost. Also, the clip-shaped conductor 210 may be inserted into the groove 1202, thereby preventing the clip-shaped conductor 210 from being twisted or bent after the combination, and in particular, by preventing the clip-shaped conductor 210 from falling down or being out of position in a reflow process after SMD.

Figure 9:
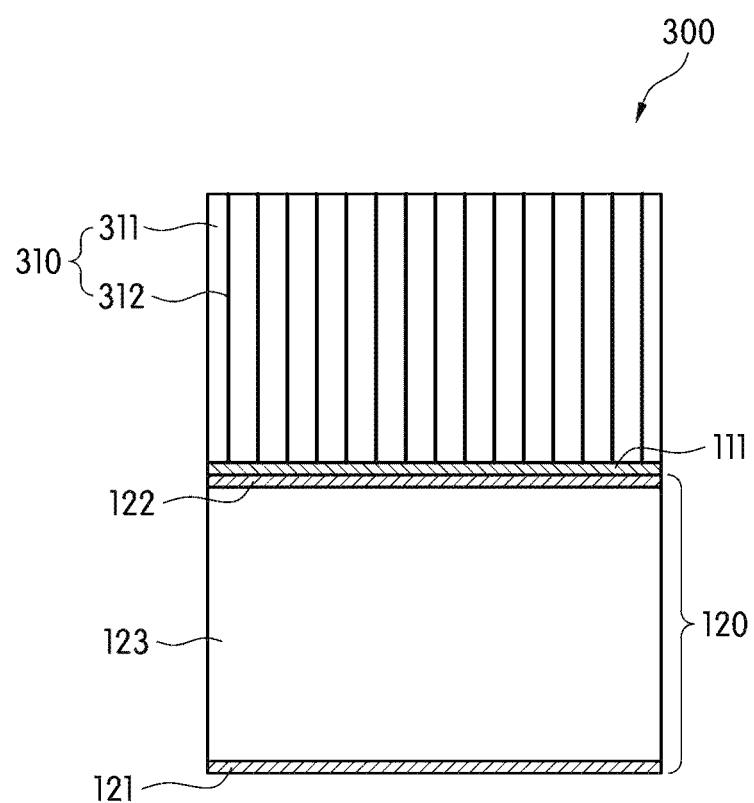
FIGS. 9 and 10 are sectional views of still another example of a functional contactor according to an embodiment of the present invention.
Figure 10:
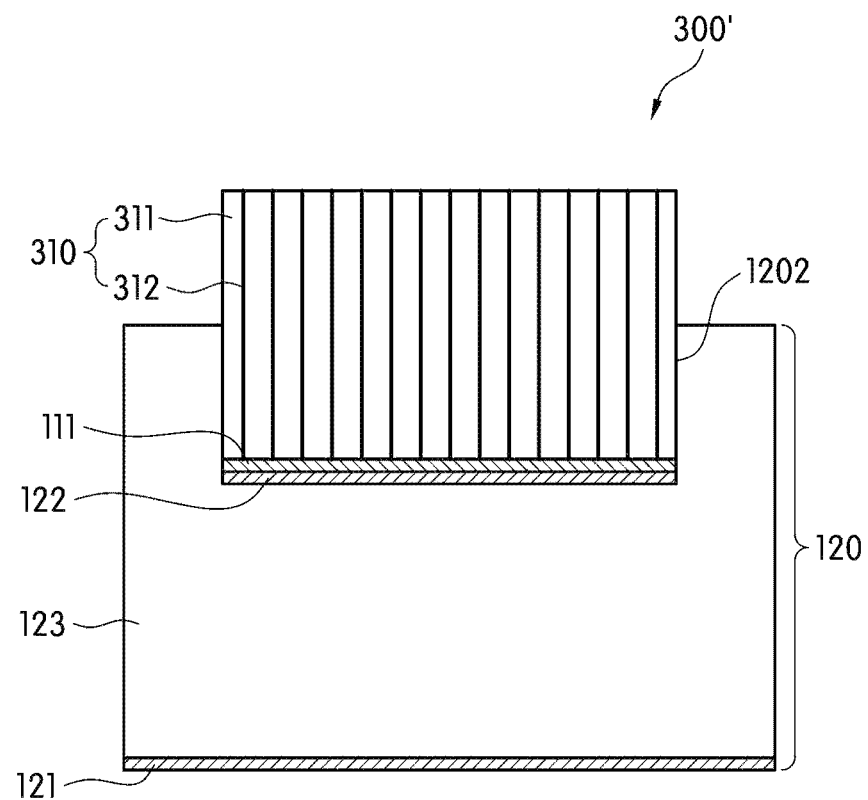

As shown in FIGS. 9 and 10, when functional contactors 300 and 300' each have a conductive elastic part which is a silicone rubber pad 310, the silicone rubber pad 310 includes a main body 311 and a conductive wire 312.

The main body 311 may be made of silicone rubber and may have an upper portion brought into surface contact with a conductor 12 such as an antenna or a metal housing and a lower portion electrically connected to a functional element 120.

The conductive wire 312 may be vertically formed inside the main body 311. The conductive wire 312 is used to improve electrical contact with the conductor 12 (see FIG. 1) and also to supplement elasticity of the main body 311.

For example, when the conductive wire 312 is pressed by the conductor 12, the conductive wire 312 has an upper end bent downward. When the conductor 12 is removed, the upper end is restored to its original vertical state, and thus the elasticity of the main body 311 may be supplemented.

Figure 11:
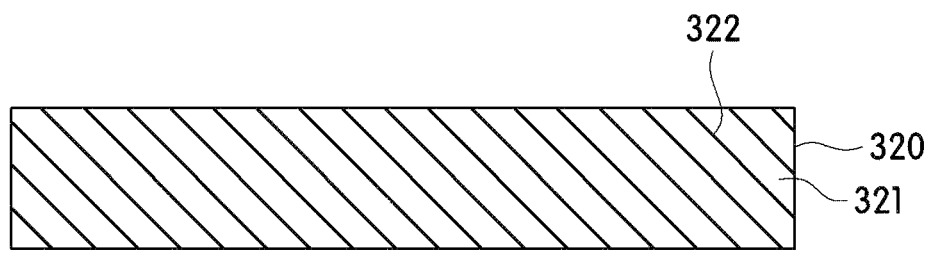
FIGS. 11 to 13 are sectional views showing various forms of a conductive elastic part of a functional contactor according to an embodiment of the present invention.

As shown in FIG. 11, when the functional contactor has a conductive elastic part which is another type of silicone rubber pad 320, the silicone rubber pad 320 includes a main body 321 and a conductive wire 322.

The main body 321 may be made of silicone rubber and may have an upper portion brought into surface contact with a conductor 12 (see FIG. 1) such as an antenna or a metal housing and a lower portion electrically connected to a functional element 120.

The conductive wire 322 may be diagonally formed inside the main body 321. The conductive wire 322 is used to improve electrical contact with the conductor 12 and also to supplement elasticity of the main body 321.

For example, when the conductive wire 312 is pressed by the conductor 12, the conductive wire 312 has an upper end bent laterally. When the conductor 12 is removed, the upper end is restored to its original vertical state, and thus the elasticity of the main body 321 may be supplemented. When the conductive wire 312 is tilted by the pressure applied by the conductor 12, it is possible to enhance the contact with the conductor 12 and thus improve communication signal conductivity.

Accordingly, compared to the vertically formed conductive wire 312 of FIG. 9 that is bent downward by the pressure applied by the conductor 12, the conductive wire 322 can have good communication signal conductivity, good elastic resilience, and long service time.

Figure 12:
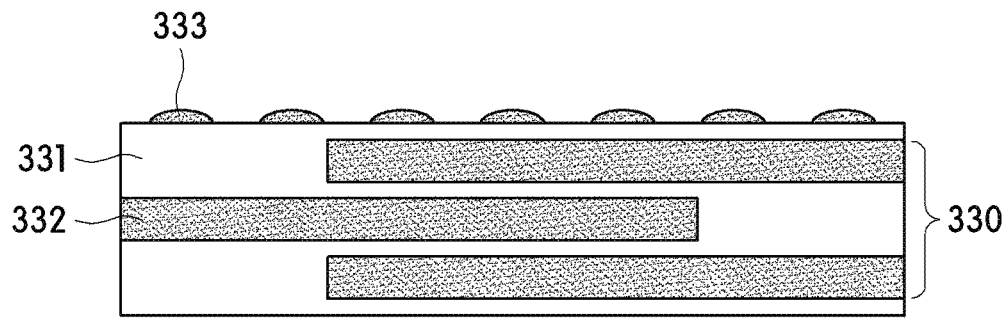

As shown in FIG. 12, when the functional contactor has a conductive elastic part which is a silicone rubber pad 330, the silicone rubber pad 330 includes a main body 331, a conductive layer 332, and a contact part 333.

The main body 331 may be made of silicone rubber and may have a lower portion electrically connected to a functional element 120.

The conductive layer 332 may have a plurality of layers that are alternately and horizontally stacked inside the main body 331 and that are made of a curable Ag paste. The conductive layer 332 is used to improve electrical contact with the conductor 12 and also to supplement elasticity of the main body 331.

For example, when the conductive layer 332 is pressed by the conductor 12, the conductive layer 332 has a central portion pressed downward. When the conductor 12 is removed, the central portion is restored to its original horizontal state, and thus the elasticity of the main body 331 may be supplemented. Accordingly, compared to the vertically formed conductive wire 312 of FIG. 9 that is bent downward by the pressure applied by the conductor 12 and the diagonally formed conductive wire 322 of FIG. 11 that is tilted laterally, the conductive layer 332 can have good elastic resilience and long service time.

The contact part 333 may be formed over the main body 331 in the shape of a curved protrusion. The contact part 333 may be brought into multi-line contact or surface contact with the conductor 12 such as an antenna or a metal housing, thereby increasing a contact area with the conductor 12. Accordingly, the silicone rubber pad 330 can have improved communication signal conductivity.

Figure 13:
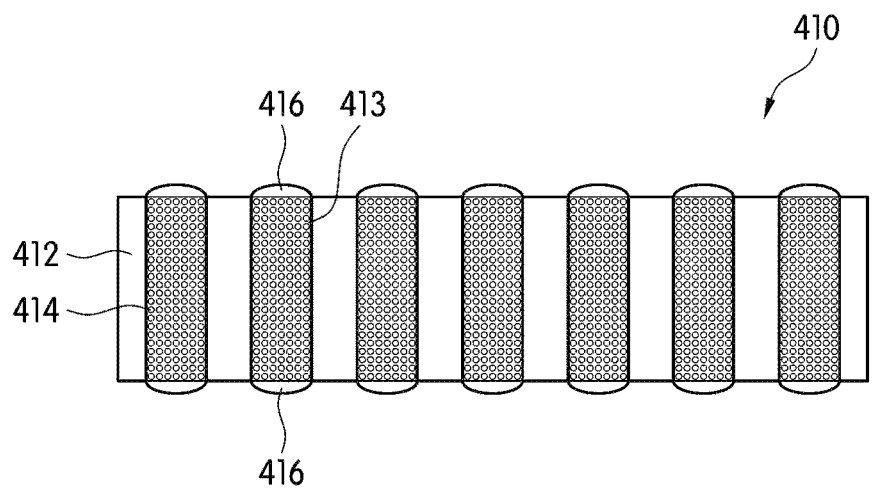
Figure 14:
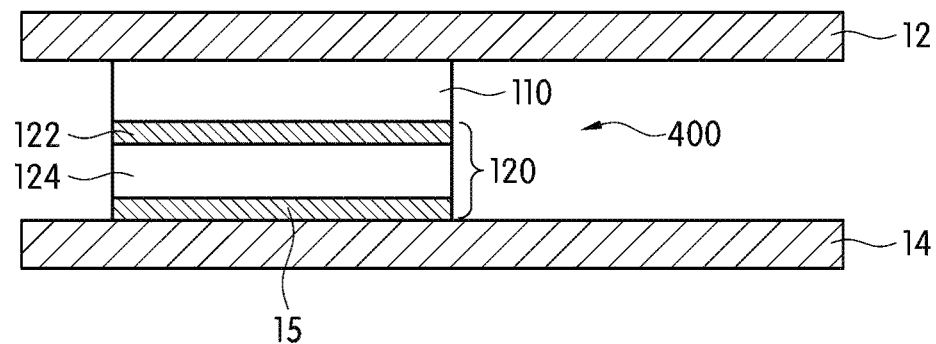
FIG. 14 is a sectional view of still another example in which a functional contactor is applied to a portable electronic device according to an embodiment of the present invention.

As shown in FIG. 13, when the conductive elastic part is a silicone rubber pad 410 containing conductive particles, the silicone rubber pad 410 includes a main body 412, a conductive part 414, and a contact part 416.

The main body 412 may be made of non-conductive silicone rubber and may have through-holes 413 vertically formed at multiple positions inside the main body 412. In this case, the main body 412 may be brought into contact with the conductor 12 through a contact part 416 formed at one side of the main body 412 and may be electrically connected to the functional element 120 through a contact part 416 formed at the other side.

The conductive part 414 may be made of conductive silicone rubber and conductive particles. The conductive part 414 may be formed by filling conductive silicone rubber and conductive particles in the through-holes 413. Here, the conductive silicone rubber may function to fasten the conductive particles in the through-holes 413, and the conductive particles may be regularly or irregularly dispersed in the conductive silicone rubber.

In this case, when pressure or heat is not externally applied to the conductive particles, the conductive particles may be spaced apart from each other and thus not electrically connected to each other. When pressure or heat is externally applied to the conductive particles, the conductive particles may be brought into contact with each other and thus electrically connected to each other.

The conductive part 414 may realize electrical contact with the conductor 12 by the conductive particles and also may realize shrinkage and expansion by the conductive silicone rubber. Accordingly, the conductive part 414 may provide electrical contact and also elastic resilience due to the applied pressure.

For example, when the conductive part 414 is pressed by the conductor 12, the conductive silicone rubber is shrunk, and the conductive particles are brought into contact with each other. Thus, the electrical connection is made by the conductive particles. When the conductor 12 is removed, the conductive particles may be restored to their original state by the elasticity of the conductive silicone rubber. Accordingly, compared to the conductive wires 312 and 322 or the conductive layer 332 of FIGS. 9 to 12, the conductive part 414 can have good elastic resilience. In particular, the conductive part 414 can have reduced internal deformation and thus can have a long service time because the conductive part 414 is made of the same or similar material as the main body 412.

The contact part 416 may be formed at both sides of the conductive part 414 in the shape of a curved protrusion. The contact part 416 may be brought into multi-line contact or surface contact with the conductor 12, thereby increasing a contact area with the conductor 12. Accordingly, the silicone rubber pad 410 may reduce leakage current and static electricity or may improve communication signal conductivity.

As shown in FIGS. 14 to 17, when the functional element is a function part 120' including only one internal electrode, a conductive pad 15 of a circuit board 14 may function as another electrode. That is, functional contactors 400 and 400' each include a conductive elastic part 110 and the functional element 120'.

Here, the function part 120' includes only one internal electrode 122, and the function part 120' is mounted on the conductive pad 15 of the circuit board 14. Thus, the conductive pad 15 functions as another electrode of the function part 120'. Here, a capacitor may be formed between the conductive pad 15 and the internal electrode 122 of the function part 120'.

In this case, the function part 120' may be combined with the conductive pad 15 by means of an insulating adhesive layer.

By removing a redundant element when a conductive pattern of the circuit board is mounted on the circuit board and used as another electrode, instead of separately configuring the electrode of the functional element and the conductive pad on the circuit board, it is possible to reduce a manufacturing cost and save resources needed to produce the functional element.

Figure 15:
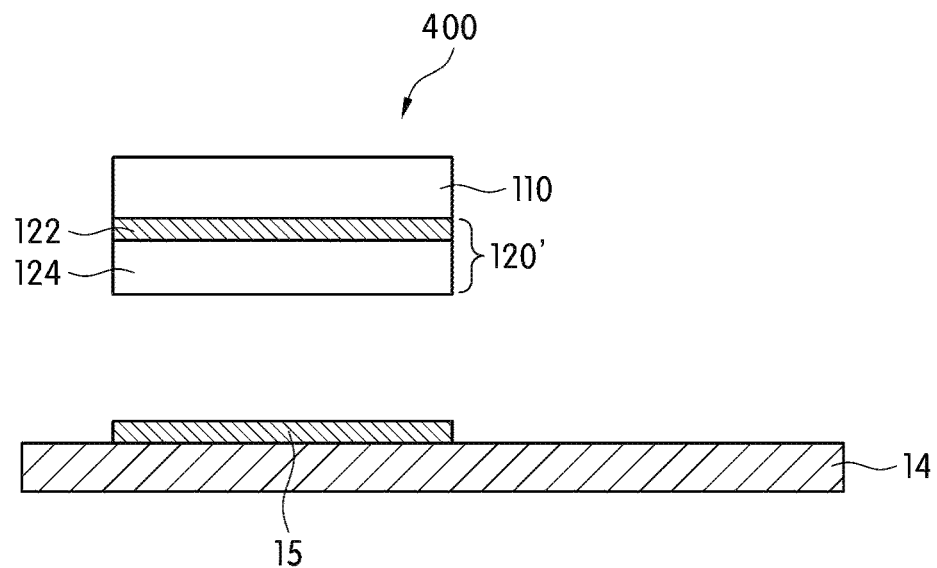
FIG. 15 is a sectional view of an example in which the functional contactor is separated from the portable electronic device in FIG. 14.

As shown in FIG. 15, the function part 120' includes the internal electrode 122 and the dielectric 124.

The function part 120' may be mounted on the conductive pad 15 of the circuit board 14. In this case, the internal electrode 122 and the conductive pad 15 may form electrodes of a functional element corresponding to the function part 120'. That is, a capacitor may be formed between the conductive pad 15 and the internal electrode 122 of the function part 120'.

The capacitor formed by the function part 120' and the conductive pad 15 can prevent damage to the user, such as electric shock or the like through a conductor such as a metal case, or breakage of the internal circuit. For example, the capacitor can block a leakage current of an external power source input from the ground of the circuit board of the electronic device and can pass a communication signal input from the conductor 12.

The internal electrode 122 is disposed at an upper portion of the functional part 120' and is electrically connected to a lower portion of the conductive elastic part 110.

Figure 16:
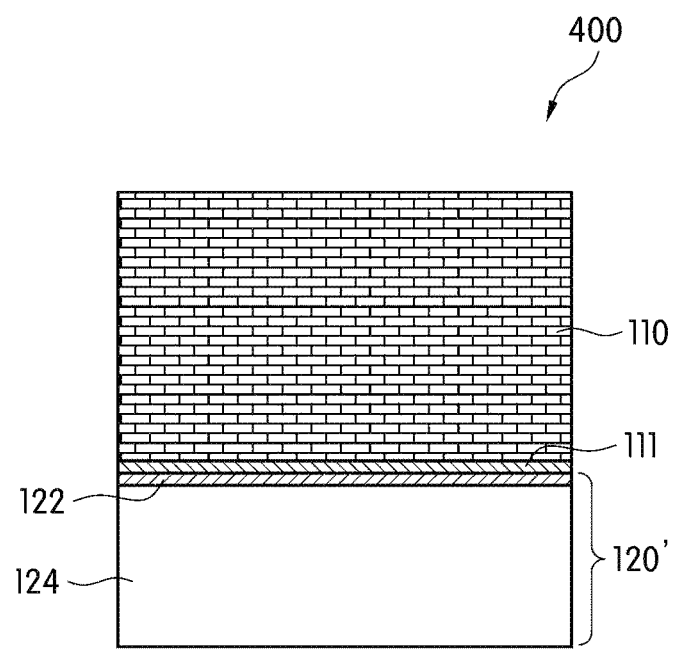
FIGS. 16 and 17 are sectional views of still another example of a functional contactor according to an embodiment of the present invention.

In this case, as shown in FIG. 16, the internal electrode 122 at the upper portion of the function part 120' may be coated with a conductive adhesive layer 111, and the conductive gasket 110 may be stacked on the function part 120' by means of the conductive adhesive layer 111. Alternatively, the conductive gasket 110 may be stacked on the function part 120' through soldering.

Figure 17:
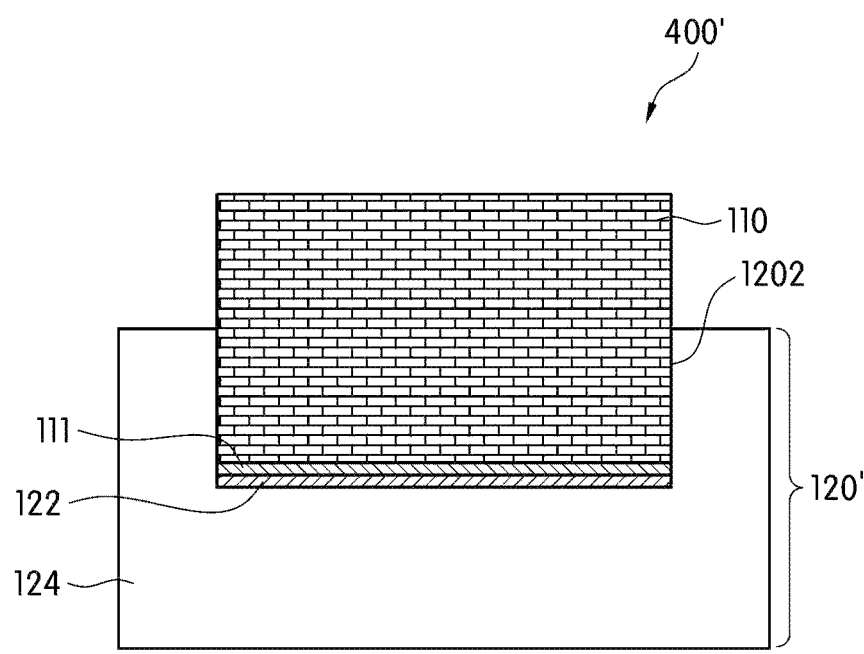

As shown in FIG. 17, the function part 120' may have a groove 1202 provided on an upper surface thereof. Here, the internal electrode 122 may be provided on a bottom surface of the groove 1202 of the function part 120'. In this case, the conductive gasket 110 may be inserted into and stacked on the groove 1202 by means of the conductive adhesive layer 111 or a solder.

The dielectric 124 is formed under the internal electrode 122 and is mounted on the conductive pad 15 of the circuit board 14. In this case, the dielectric 124 may be mounted on and combined with the conductive pad 15 by means of insulating adhesive. The dielectric 124 may be made of a ceramic material.

Here, the dielectric constant and the thickness of the dielectric 124, the area of the internal electrode 122, and the area of the conductive pad 15 may be set so that a withstand voltage between the internal electrode 122 of the function part 120' and the conductive pad 15 of the circuit board 14 is higher than the rated voltage of the external power source of the electronic device and so that a capacitance capable of passing a communication signal input from the conductor 12 is formed.

In this embodiment, it has been described that the functional contactor 400 is formed by combining the conductive elastic part 110 and the function part 120' by means of a conductive adhesive layer or through soldering, but the present invention is not limited thereto.

As an example, the functional contactor 400 is formed by providing a mounting pad on a lower surface of the conductive elastic part and combining a function part with a lower surface of the mounting pad. In this case, the function part includes only the dielectric.

Here, the mounting pad is provided to directly combine the conductive elastic part with a pad of the circuit board through soldering, and is a copper plate or a plate coated with stainless steel (SUS) and chromium.

In FIGS. 16 and 17, the mounting pad of the conductive elastic part corresponds to the internal electrode 122 of the function part 120'.

In this case, the conductive elastic part and the function part may be combined with each other by means of an insulating adhesive layer. That is, the mounting pad of the conductive elastic part may be stacked on the dielectric of the function part by means of the insulating adhesive layer.

In this embodiment, the shapes of the conductive elastic part and the function part have not been described in detail, but it will be appreciated that the same technical features as described with reference to FIGS. 5 to 14 can be applied thereto.

A functional contactor 500 including a functional element having a large-area electrode to increase the capacitance will be described in detail below with reference to FIGS. 18 and 19.

Figure 18:
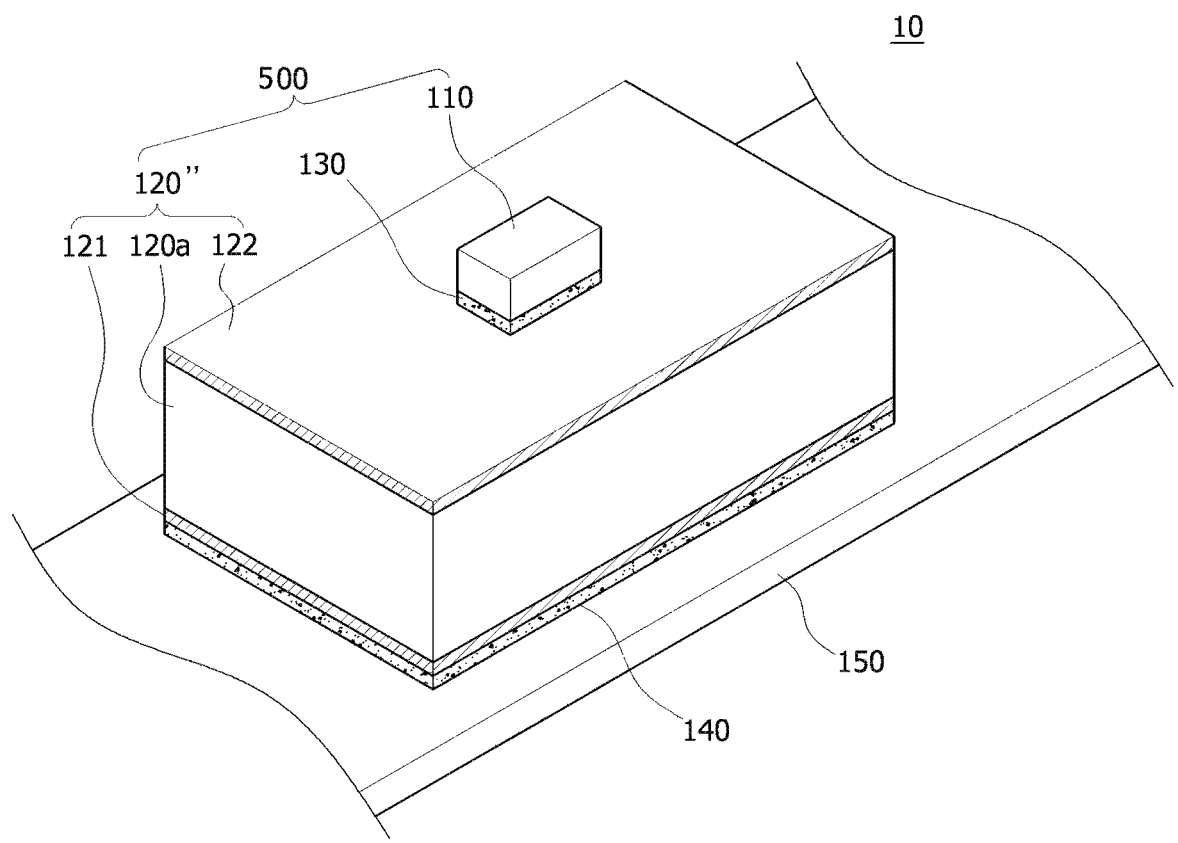
FIGS. 18 and 19 are a perspective view and a sectional view showing a functional circuit component including a functional contactor according to an embodiment of the present invention.
Figure 19:
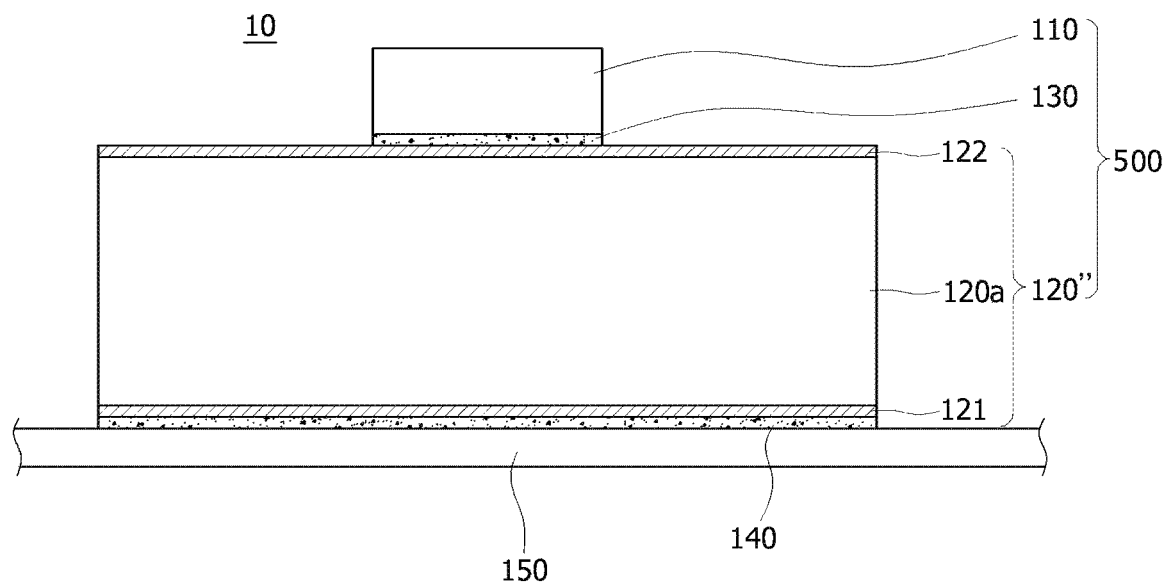

As shown in FIGS. 18 and 19, a functional circuit component 10 according to an embodiment of the present invention includes a functional contactor 500, a first conductive bonding member 140, and a substrate 150.

Here, when the substrate 150 is electrically connected to a conductive bracket or when a shield can is mounted thereon, the functional contactor 500 may electrically connect an external conductor such as a metal case to an internal conductor such as a conductive bracket or a shield can. In this case, the conductive bracket may be made of a conductive material, for example, magnesium (Mg).

The functional contactor 500 includes a conductive elastic part 110, a functional element 120", and a second conductive bonding member 130.

The functional element 120" is electrically connected in series to the conductive elastic part 110 and includes a first electrode, a second electrode 122, and a plastic material 120a that have large areas in order to increase the capacitance.

The first electrode 121 is electrically connected to the substrate 150 of the electronic device by means of the first conductive bonding member 140. As an example, the first electrode 121 may be mounted on the substrate 150 through an SMT soldering process.

In addition, the first electrode 121 may be combined with an internal conductor such as a bracket or a shield can or an external conductor such as a metal case by means of the first conductive bonding member 140.

The second electrode 122 is electrically connected to the conductive elastic part 110 by means of the second conductive bonding member 130. As an example, the second electrode 122 may be brought into contact with the conductive elastic part 110 through an SMT soldering process.

In the functional element 120", the plastic material 120a may be formed between the first electrode 121 and the second electrode 122. Here, the plastic material 120a may be made of a ceramic material or a varistor material. Additionally, the plastic material 120a may have an internal electrode.

It will be appreciated that the functional element 120" has the same function, internal structure, and shape as those of the functional elements that have been described with reference to FIGS. 1 to 4 and 15 to 17.

Accordingly, the functional element 120" may block a leakage current of an external power source input from the ground of the substrate 150 to the conductor. In this case, the functional element 120" may be configured to have a breakdown voltage Vbr or a withstand voltage higher than the rated voltage of the external power source of the electronic device. Here, the rated voltage may be a national standard rated voltage and may be one of, for example, 240V, 110V, 220V, 120V, and 100V.

Also, when the conductor has an antenna function, the first electrode 121 and the second electrode 122 spaced apart from each other with the plastic material 120a disposed therebetween function even as a capacitor. Thus, the functional element 120" can block the leakage current of the external power source and also pass a communication signal input from the conductor.

Also, the functional element 120" may pass an electrostatic discharge (ESD) input from the conductor without dielectric breakdown. In this case, the functional element 120" may be configured to have a breakdown voltage Vbr smaller than a dielectric breakdown voltage Vcp of the plastic material 120a.

Accordingly, the functional contactor 500 may pass a communication signal and an electrostatic discharge (ESD) by electrically connecting the substrate 150 to the conductor, but may cut off a leakage current of an external power source originating from the substrate 150 to block the leakage current from being delivered to the conductor.

The second conductive bonding member 130 is interposed between and configured to electrically connect the conductive elastic part 110 and the second electrode 122 or is interposed between and configured to electrically connect the conductive elastic part 110 and the functional element 120".

As an example, the second conductive bonding member 130 may be bonded to the conductive elastic part 110 through a soldering process.

Typically, the soldering process is a process of mounting a component on a circuit board or the like, applying a high-temperature heat source to electrically connect the circuit board and the component, and melting a bonding member to stably bond the component to the substrate. Through the process, heterogeneous components performing different functions may be integrated into one component. The component obtained by the integration through soldering may be mounted on the circuit board or the like through a soldering process. Here, heat and/or pressure applied to the integrated component may melt and solidify the bonding member interposed between the component and the substrate so that the integrated component can be bonded to the substrate.

However, the heat and/or pressure applied to the integrated component do not only affect the bonding member interposed between the component and the substrate, but also affect another bonding member interposed to integrate the components. Therefore, there is a risk that the integrated component will have significantly lowered electrical connection reliability.

Specifically, when the integrated component is a component obtained by electrically connecting and fastening two elements such as the functional contactor 500 according to the present invention by means of the conductive bonding members 130 and 140, the soldering process includes bonding the conductive elastic part 110 and the functional element 120" through primary soldering and then bonding the functional element 120" having the conductive elastic part 110 stacked thereon to the substrate 150 through secondary soldering. In this case, a part at which the contactor and the functional element are bonded to each other is melted by heat generated through the secondary soldering. Thus, the adhesiveness and reliability of the functional contactor 500 may deteriorate, and electrical failure may occur in the functional contactor 500.

Accordingly, in order to solve the aforementioned problems, the functional contactor 500 according to the present invention includes a first conductive bonding member 140 and a second conductive bonding member 130, which will be described below, as the bonding member of the soldering process. Here, the melting point of the second conductive bonding member 130 may be set to be higher than the melting point of the first conductive bonding member 140.

The second conductive bonding member 130 may be formed by stacking one or more of Ti, Cr, Pt, Ni, Au, In, Sn, Ag, Pb, Sn, Bi, Sb, Cd, and Cu or may contain an alloy thereof. More preferably, the second conductive bonding member 130 may contain not Pb but Sn and Ag in order to manage hazardous materials.

Also, the second conductive bonding member 130 may have a melting point of 150° C. to 300° C. When the melting point of the second conductive bonding member 130 is less than 150° C., the second conductive bonding member 130 is melt by the heat and/or pressure applied during a secondary soldering process for the first conductive bonding member 140, which will be described below. Accordingly, the adhesiveness and reliability of the functional contactor 500 may deteriorate, and the electrical failure may occur in the functional contactor 500. Also, when the melting point of the second conductive bonding member 130 exceeds 300° C., the circuit components of the functional contactor 500 may be damaged due to a relatively long preheating time and a high-temperature heat source.

In particular, when the second conductive bonding member 130 that does not contain Pb is used according to an embodiment of the present invention, there is a need to perform a soldering process at a temperature higher by at least 30° C. than usual due to a long preheating time and a high preheating temperature, compared to a conventional bonding member containing a SnPb-based material. In addition, unlike the bonding member containing a SnPb-based material, there is a need for a soldering section that maintains a temperature higher by at least 30° C. than usual for a certain time, and there is a risk that thermal damage will occur due to the melting of the second conductive bonding member 130 during the secondary soldering process for the first conductive bonding member 140. Accordingly, in this case, the melting point of the second conductive bonding member 130 may be set to be higher by at least 30° C. than the melting point of the first conductive bonding member 140. Preferably, the second conductive bonding member 130 may have a melting point of 245° C. to 270° C.

As described above, the second conductive bonding member 130 may have a higher melting point than the first conductive bonding member 140, which will be described below. Accordingly, a portion at which the conductive elastic part 110 and the functional element 120" are bonded to each other by the second conductive bonding member 130 is not melted or deformed but maintains reliability even when a heat source is applied during a secondary soldering process for the functional element 120" and the substrate 150 using the first conductive bonding member 140. Thus, it is possible to enhance electrical contact of the functional contactor 500.

The first conductive bonding member 140 may fasten and electrically connect the functional contactor 500 to the substrate 150. As an example, the first conductive bonding member 140 may be interposed between the functional contactor 500 and the first electrode 121 and configured to bond the first electrode to the substrate 150.

The first conductive bonding member 140 may be formed by stacking one or more of Ti, Cr, Pt, Ni, Au, In, Sn, Ag, Pb, Sn, Bi, Sb, Cd, and Cu or may contain an alloy thereof. More preferably, the first conductive bonding member 140 may contain not Pb but Sn and Ag in order to manage hazardous materials.

Also, the first conductive bonding member 140 may have a melting point of 100° C. to 240° C. When the melting point of the first conductive bonding member 140 is less than 100° C., the material of which the first conductive bonding member 140 is made is not melted for the bonding during the soldering process, and thus adhesiveness may be reduced. When the melting point of the first conductive bonding member 140 exceeds 240° C., the circuit components of the functional contactor 500 may be damaged due to a relatively long preheating time and a high-temperature heat source.

In particular, when the second conductive bonding member 130 that does not contain Pb is used according to an embodiment of the present invention, there is a need to perform a soldering process at a temperature that is higher by at least 30° C. than usual due to a long preheating time and a high preheating temperature, compared to a conventional bonding member containing a SnPb-based material. In addition, unlike the bonding member containing a SnPb-based material, there is a need for a soldering section that maintains a temperature higher by at least 30° C. than usual for a certain time, and there is a risk that thermal damage will occur due to the melting of the second conductive bonding member 130 during the secondary soldering process for the first conductive bonding member 140. Accordingly, in this case, the melting point of the first conductive bonding member 140 may be set to be lower by at least 30° C. than the melting point of the second conductive bonding member 130. Preferably, the first conductive bonding member 140 may have a melting point of 215° C. to 240° C.

By setting the melting point of the second conductive bonding member 130 for bonding the functional element 120" to the conductive elastic part 110 or the second electrode 122 to the conductive elastic part 110 to be higher than the melting point of the first conductive bonding member 140 for bonding the functional contactor 500 to the substrate 150 or the first electrode 121 to the substrate 150, a bonding point related to the second conductive bonding member 130 is not melted or deformed but maintains reliability even during the two soldering processes. Thus, the present invention can provide a functional circuit component 10 including the functional contactor 500 having enhanced electrical characteristics.

The present invention will be described in detail with reference to the following embodiments, but the following embodiments should not be construed as limiting the scope of the present invention, but should be construed as facilitating an understanding of the present invention.

Embodiment 1

First, a functional contactor was manufactured by using a reflow soldering apparatus (BK-350S) to electrically bond a conductive elastic part (Hyupjin Connector, Co. Ltd.) to a functional element (an electric shock protection device; Amotech Corp.) by means of a second conductive bonding member that has a melting point of 183° C. and contains Sn63Pb37 (an alloy containing 63 wt % Sn and 37 wt % Pb). Subsequently, a circuit component was manufactured by using the reflow soldering apparatus (BK-350S) to fasten the functional connector onto a substrate by means of a first conductive bonding member that has a melting point of 199° C. and contains Sn50Pb50.

Embodiments 2 to 6

Circuit components shown in Table 1 were manufactured in the same manner as those of Embodiment 1. However, the melting points and materials of the first conductive bonding member and the second conductive bonding member were changed as shown in Table 1.

Comparative Examples 1 and 2

Circuit components shown in Table 1 were manufactured in the same manner as those of Embodiment 1. However, the melting points and materials of the first conductive bonding member and the second conductive bonding member were changed as shown in Table 1.

Experimental Example 1

The physical properties of the circuit components manufactured in the embodiments and the comparative examples were evaluated and shown in Table 1.

1. Degree of Contamination Due to Second Conductive Bonding Member

The degree of contamination due to the melting of the second conductive bonding member was evaluated by visually checking the degree of contamination of the second conductive bonding member with respect to the functional contactor fastened to the substrate. On the basis that the area of contamination due to the second conductive bonding member in Comparative Example 1 is 100, the areas of contamination due to the second conductive bonding members in the embodiments and the other comparative example were evaluated as relative values of 0 to 100 and shown in the following Table 1. In this case, the degree of contamination being 0 means no blurring.

2. Degree of Misalignment of Conductive Elastic Part

The degree of misalignment of the conductive elastic part due to the melting of the second conductive bonding member was evaluated by visually checking the degree of misalignment of the conductive elastic part connected to an upper surface of the functional element with respect to the functional contactor fastened to the substrate. On the basis that the angle of misalignment of the conductive elastic part of the circuit component manufactured in Comparative Example 1 is 100, the angles of misalignment of the conductive elastic parts due to the melting of the second conductive bonding members in the embodiments and the other comparative example were evaluated as relative values of 0 to 100 and shown in the following Table 1. In this case, the degree of misalignment being 0 means no misalignment.

As seen in Table 1, Embodiments 1 to 3 and Comparative Example 1 are associated with a bonding member containing Pb, and Embodiments 4 to 6 and Comparative Example 2 are associated with a bonding member not containing Pb.

First, referring to Embodiments 1 to 6 and the comparative examples, it can be seen that the degree of contamination of the second conductive bonding member 130 for electrically bonding the conductive elastic part 110 to the functional element 120″ and the degree of misalignment of the conductive elastic part 110 were even larger in Comparative Examples 1 and 2 in which the first conductive bonding member 140 has the same melting point as the second conductive bonding member 130 than in Embodiments 1 to 6 in which the second conductive bonding member 130 has a higher melting point than the first conductive bonding member 140. That is, the second conductive bonding member 130 may be partially deformed, melted, or misaligned by bonding the conductive elastic part 110 to the functional element 120″ through primary soldering and then electrically bonding the conductive elastic part 110 and the functional element 120″ by heat and/or pressure generated through secondary soldering in which the functional element 120″ having the conductive elastic part 110 stacked thereon is bonded to the substrate 150. Accordingly, in the comparative examples in which the melting point of the first conductive bonding member 140 is set to be the same as the melting point of the second conductive bonding member 130, the adhesiveness and reliability of the functional contactor 500 may deteriorate, and electrical failure may occur in the functional contactor 500.

Next, referring to Embodiments 1 to 3, it can be seen that the degree of contamination of the second conductive bonding member 130 and the degree of misalignment of the conductive elastic part 110 were significantly more decreased in Embodiment 3 in which the melting point of the first conductive bonding member 140 and the melting point of the second conductive bonding member 130 have a difference of 35° C., which exceeds 30° C. that is the numerical range of the present invention, than in Embodiments 1 and 2 in which the melting point of the first conductive bonding member 140 and the melting point of the second conductive bonding member 130 have differences of 16° C. and 27° C., respectively. That is, when the melting point of the first conductive bonding member 140 is set to be higher than the melting point of the second conductive bonding member 130, it can be seen that the second conductive bonding member 130 is relatively less deformed by the heat and/or pressure generated through the secondary soldering. In particular, through Embodiment 3,

TABLE 1

| Category | First Conductive Bonding Member | | Second Conductive Bonding Member | | Difference in Melting Point (° C.) | Degree of Contamination of Second Conductive Bonding Member | Degree of Misalignment of Conductive Elastic Part |
| --- | --- | --- | --- | --- | --- | --- | --- |
| | Material | Melting Point (° C.) | Material | Melting Point (° C.) | | | |
| Embodiment 1 | Sn63Pb37 | 183 | Sn50Pb50 | 199 | 16 | 12 | 14 |
| Embodiment 2 | Sn63Pb37 | 183 | Sn40Pb60 | 210 | 27 | 11 | 13 |
| Embodiment 3 | Sn63Pb37 | 183 | Sn30Pb70 | 218 | 35 | 2 | 0 |
| Embodiment 4 | Sn96.5Ag3Cu0.5 | 219 | Sn99.25Cu0.75 | 229 | 10 | 16 | 15 |
| Embodiment 5 | Sn96.5Ag3Cu0.5 | 219 | Sn95Sb5 | 241 | 22 | 13 | 13 |
| Embodiment 6 | Sn96.5Ag3Cu0.5 | 219 | Sn90Sb10 | 250 | 31 | 1 | 0 |
| Comparative Example 1 | Sn63Pb37 | 183 | Sn63Pb37 | 183 | 0 | 100 | 100 |
| Comparative Example 2 | Sn96.5Ag3Cu0.5 | 219 | Sn96.5Ag3Cu0.5 | 219 | 0 | 98 | 97 | when the difference between the melting point of the first conductive bonding member 140 and the melting point of the second conductive bonding member 130 exceeds 30° C., it can be seen that it is possible to minimize the deformation of the second conductive bonding member 130.

Likewise, even through Embodiments 4 to 6 in which Pb is not contained, when the difference between the melting point of the first conductive bonding member 140 and the melting point of the second conductive bonding member 130 exceeds 30° C., it is possible to minimize the degree of contamination of the second conductive bonding member 130 and the degree of misalignment of the conductive elastic part 110.

In a portable electronic device, the functional contactor as described above may be disposed on a human-touchable conductor 12 and a circuit board 14. Here, the functional contactor may be mounted on a mounting pad of the circuit board 14.

According to the disposition, the portable electronic device can prevent damage to a user or breakage of an internal circuit through the conductor.

While embodiments of the present invention have been described above, the scope of the present invention is not limited to the disclosed embodiments. Those skilled in the art of the present invention can readily suggest another embodiment by adding, modifying, deleting, or adding components without departing from the scope of the present invention, but the suggested embodiment is construed as being within the scope of the present invention.

What is claimed is:

1. A functional contactor comprising:
   a conductive elastic part, wherein the conductive elastic part is configured to be brought into electrical contact with a metal case, wherein the metal case is a conductor of an electronic device, and wherein the metal case is used as an antenna; and
   a functional element having a first electrode mounted on a circuit board of the electronic device, a second electrode electrically connected to a lower side of the conductive elastic part, and a dielectric formed between the first electrode and the second electrode, wherein the functional element has a withstand voltage higher than a rated voltage of an external power source of the electronic device, blocks a leakage current of the external power source input from a ground of the circuit board of the electronic device and passes a communication signal input from the metal case,
   wherein the conductive elastic part is stacked on the second electrode of the functional element by a conductive adhesive layer or through a solder,
   wherein the functional element has a groove disposed at an upper side,
   wherein the second electrode is formed on a bottom surface of the groove, and
   wherein the conductive elastic part is fastened inside the groove by the conductive adhesive layer or through the solder.

2. The functional contactor of claim 1,
   wherein the dielectric is made of a ceramic material, and
   wherein the ceramic material is a metal oxide compound comprising one or more selected from the group consisting of $Er_2O_3$, $Dy_2O_3$, $Ho_2O_3$, $V_2O_5$, CoO, $MoO_3$, $SnO_2$, $BaTiO_3$, and $Nd_2O_3$,
   wherein the ceramic material is a fired ceramic or a ferrite, or contains any one of a ZnO-based varistor material, a Pr-based material, and a Bi-based material.

3. The functional contactor of claim 1, wherein the conductive elastic part is one selected from the group consisting of a conductive gasket, a silicone rubber pad, and a clip-shaped conductor with elasticity.

4. A functional contactor fastened and electrically connected to a substrate of an electronic device by means of a first conductive bonding member, the functional contactor comprising:
   a functional element including a first electrode and a second electrode, the first electrode being brought into contact with the first conductive bonding member;
   a conductive elastic part disposed at an upper portion of the functional element; and
   a second conductive bonding member interposed between the conductive elastic part and the functional element or between the conductive elastic part and the second electrode in order to fasten and electrically connect the conductive elastic part and the functional element,
   wherein the conductive elastic part is in electrical contact with a metal case of the electronic device and used as an antenna, and
   wherein the functional element has a withstand voltage higher than a rated voltage of an external power source of the electronic device, and
   wherein the functional element has an electric shock prevention function for blocking a leakage current of an external power source input from a ground of a substrate of an electronic device, a communication signal bypass function for passing a communication signal input from a conductive case, and an electrostatic discharge (ESD) protection function for passing static electricity without dielectric breakdown when the static electricity is input from the conductive case,
   wherein the second conductive bonding member has a higher melting point 30° C. or more than the first conductive bonding member,
   wherein the conductive elastic part is stacked on the second electrode of the functional element by a conductive adhesive layer or through a solder,
   wherein the functional element has a groove disposed at an upper side,
   wherein the second electrode is formed on a bottom surface of the groove, and
   wherein the conductive elastic part is fastened inside the groove by the conductive adhesive layer or through the solder.

5. The functional contactor of claim 4, wherein the first conductive bonding member and the second conductive bonding member are made of different materials.

6. The functional contactor of claim 4, wherein the conductive elastic part is brought in line contact or point contact with a conductor to decrease galvanic corrosion.

* * * * *